United States Patent
Conte et al.

(10) Patent No.: US 9,627,011 B1
(45) Date of Patent: Apr. 18, 2017

(54) SENSE AMPLIFIER CIRCUIT WITH OFFSET COMPENSATION FOR A NON-VOLATILE MEMORY DEVICE

(71) Applicants: STMicroelectronics S.r.l, Agrate Brianza (IT); STMicroelectronics (Rousset) SAS, Rousset (FR)

(72) Inventors: Antonino Conte, Tremestieri Etneo (IT); Francesco La Rosa, Rousset (FR)

(73) Assignees: STMicroelectronics S.r.l., Agrate Brianza (IT); STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/212,211

(22) Filed: Jul. 16, 2016

(30) Foreign Application Priority Data

Nov. 24, 2015 (IT) .................. 102015000076148

(51) Int. Cl.
*G11C 7/02* (2006.01)
*G11C 7/08* (2006.01)
*G11C 7/12* (2006.01)

(52) U.S. Cl.
CPC . *G11C 7/08* (2013.01); *G11C 7/12* (2013.01)

(58) Field of Classification Search
USPC .................. 365/207, 210.1, 210.11, 206
See application file for complete search history.

(56) References Cited

U.S. PATENT DOCUMENTS

| | | | |
|---|---|---|---|
| 5,729,492 A * | 3/1998 | Campardo | G11C 16/28 365/185.13 |
| 6,320,808 B1 * | 11/2001 | Conte | G11C 7/062 365/185.2 |
| 2005/0213387 A1* | 9/2005 | Kubo | G11C 5/145 365/185.21 |
| 2007/0279990 A1 | 12/2007 | Choy | |
| 2012/0287740 A1 | 11/2012 | Vimercati | |
| 2013/0127526 A1 | 5/2013 | Sayuk | |

* cited by examiner

*Primary Examiner* — Vu Le
(74) *Attorney, Agent, or Firm* — Slater Matsil, LLP (57) ABSTRACT

A method for operating a non-volatile memory device uses a sense amplifier that includes a first branch and a second branch. During a pre-charging step, a bit line of a memory array of the non-volatile memory device is biased in order to pre-charge the bit line. During the pre-charging step, an offset between the first branch and the second branch is detected and stored. During a reading step subsequent to the pre-charging step, a cell current is received from the bit line at the first branch and a reference current is received from a current-reference structure at the second branch. During the reading step, and amplified voltage is generated as a function of the cell current and the reference current. During the reading step, an output voltage is generated based on the amplified voltage compensated by the offset stored during the pre-charging step.

21 Claims, 7 Drawing Sheets

SENSE AMPLIFIER CIRCUIT WITH OFFSET COMPENSATION FOR A NON-VOLATILE MEMORY DEVICE

This application claims priority to Italian Patent Application No. 102015000076148, filed on Nov. 24, 2015, which application is hereby incorporated herein by reference.

TECHNICAL FIELD

The present invention relates to a sense-amplifier circuit with offset compensation for a non-volatile memory device.

BACKGROUND

Figure 1:
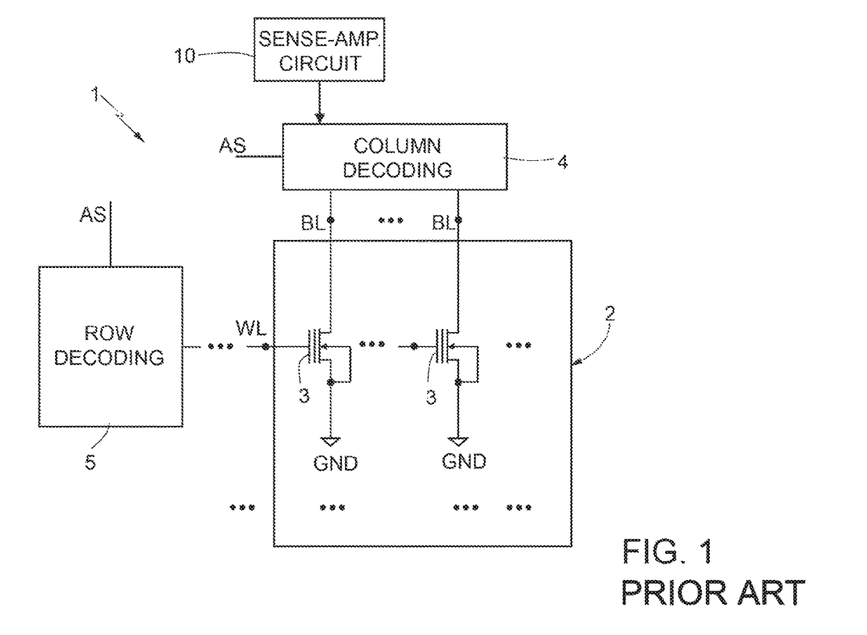
FIG. 1 shows an overall block diagram of a non-volatile memory device of a known type.

In a known way, and as shown schematically in FIG. 1, a non-volatile memory device, designated by 1, for example, of a flash type or of the PCM (Phase-Change Memory) type, in general comprises a memory array 2 made up of a plurality of memory cells 3, arranged in rows (wordlines WL) and columns (bitlines BL).

Each memory cell 3 is constituted by a storage element, for example, formed by a floating-gate transistor in flash memories, with its gate terminal designed to be coupled to a respective wordline WL, a first conduction terminal designed to be coupled to a respective bitline BL, and a second conduction terminal connected to a reference potential (for example, ground, GND). In particular, the gate terminals of the memory cells 3 of a same wordline WL are connected together.

A column-decoder circuit 4 and a row-decoder circuit 5 enable selection, on the basis of address signals received at input (generated in a per se known manner and designated as a whole by AS), of the memory cells 3, and in particular the corresponding wordlines WL and bitlines BL, each time addressed, enabling biasing thereof to appropriate voltage and current values during the memory operations.

The column-decoder circuit 4 defines in particular a reading path, designed to create a conductive path between the bitlines BL of the memory array 2 each time selected, and a sense-amplifier circuit 10, designed to compare the current circulating in the addressed memory cell 3 with a reference current in order to determine the datum stored.

SUMMARY

Embodiments of the present invention provide a sense-amplifier circuit for a non-volatile memory device that will enable an offset compensation, and in any case will present a low sensitivity to mismatches.

According to the present invention, a sense-amplifier circuit for a non-volatile memory device and a corresponding reading method are provided.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 2:
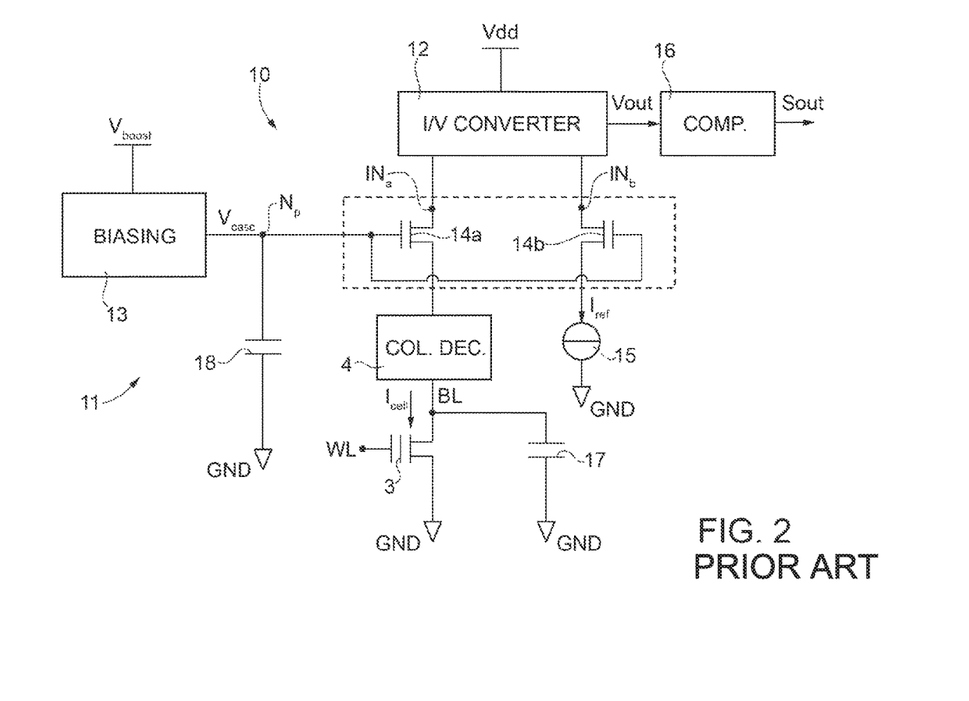
FIG. 2 shows a general block diagram of a sense-amplifier circuit in the non-volatile memory device of FIG. 1, which is also of a known type.

FIG. 2 shows a general block diagram of a sense-amplifier circuit 10 in the non-volatile memory device of FIG. 1. As is shown in FIG. 2, in a known circuit embodiment, the sense-amplifier circuit 10 in general comprises a biasing stage 11 and a current-to-voltage (I/V) converter stage 12.

The biasing stage 11 is designed to bias the bitlines BL of the memory array 2 and in turn comprises a biasing generator 13 and a pair of biasing transistors 14a, 14b, of an NMOS type, in cascode configuration.

The biasing generator 13 receives at input a voltage that may be boosted (in what follows referred to as the boosted voltage $V_{boost}$) for example, by a charge-pump voltage-booster stage (not illustrated herein), and generates at output a biasing voltage $V_{casc}$ on a biasing node N. Alternatively, and according to the value that is desired for the biasing voltage $V_{casc}$, the biasing generator 13 may receive directly a supply voltage $V_{dd}$, of a logic value (lower than the boosted voltage $V_{boost}$).

The control terminals of the biasing transistors 14a, 14b are both connected to the biasing node $N_p$ for receiving the biasing voltage $V_{casc}$.

In addition, a first biasing transistor 14a of the pair has a first conduction terminal coupled to the bitline selected, from which it receives in use a cell-reading current $I_{cell}$, through the reading path defined by the column decoder 4, and a second conduction terminal connected to a first comparison input $IN_a$ of the current-to-voltage converter stage 12.

In turn, the second biasing transistor 14b of the pair has a respective first conduction terminal coupled to a reference-current generator 15 (or, alternatively to a reference cell, in a way not illustrated herein), from which it receives a reference reading current $I_{ref}$, and a second conduction terminal connected to a second comparison input $IN_b$ of the current-to-voltage converter stage 12.

The current-to-voltage converter stage 12 further has a supply input, on which it receives the supply voltage $V_{dd}$, and is configured to make a comparison between the values of the cell-reading current $I_{cell}$ and of the reference reading current $I_{ref}$ and generate, on the basis of the result of this comparison, an output voltage $V_{out}$.

The sense-amplifier circuit 10 further comprises a comparator stage 16, which receives at input the output voltage $V_{out}$ from the current-to-voltage converter stage 12 and generates, on the basis of the value (for example, positive or negative) of the output voltage $V_{out}$, a digital reading signal $S_{out}$, which is indicative of the datum stored in the memory cell 3.

FIG. 2 further shows a parasitic line capacitor 17, electrically coupled between the bitline BL and a ground reference GND, and a biasing capacitor 18, coupled between the biasing node $N_p$ and the ground reference GND.

During operation, the reading of the data stored in the memory cells 3 envisages a first step (or phase) of pre-charging of the corresponding bitlines BL via the biasing stage 11 and the corresponding first biasing transistor 14a, which enables application of a desired pre-charging voltage as a function of the biasing voltage $V_{casc}$ (in particular, this pre-charging operation enables charging of the parasitic capacitance 17 coupled to the selected bitline BL).

The reading operation next envisages a step (o phase) of reading of the datum stored, with detection of the cell-reading current $I_{cell}$ and its comparison with the reference reading current $I_{ref}$ in order to generate the output voltage $V_{out}$ and, via the comparator stage 16, the digital output signal $S_{out}$.

For example, in the case where the cell-reading current $I_{cell}$ is higher than the reference reading current $I_{ref}$, the digital output signal $S_{out}$ may have a high logic value, '1', whereas the digital output signal $S_{out}$ may have a low logic value, '0', in the opposite case, i.e., if the cell-reading current $I_{cell}$ is lower than the reference reading current $I_{ref}$.

The present Applicant has found that the progressive reduction in dimensions (the so-called "scaling down") of memory cells, and the simultaneous requirement of increasing the electrical performance (in particular, in terms of increase of the reading speed, or likewise the reduction in the access time, and the reduction in consumption), imposed by technological progress, may entail considerable problems in ensuring proper operation of the sense-amplifier circuit.

The aforesaid requirements entail in fact correct discrimination of differences in current, between the cell-reading current $I_{cell}$ and the reference reading current $I_{ref}$, of a progressively lower value, in increasingly shorter times.

For example, in safe-storage applications (for instance, for microcontrollers of credit cards or the like), technological evolution has led to passage from a size of 90 nm to a size of 40 nm for memory cells, which is accompanied by a reduction in access time from 70 ns to 25 ns.

In these applications, a reference reading current $I_{ref}$ of a low value, of the order, for example, of 3 µA, is further envisaged, and it is required an absolute error in discriminating the value of the datum lower than 500 nA (i.e., a relative error lower than 16%).

The sense-amplifier circuit 10 has consequently to guarantee a compromise between the opposed requirements of increase in speed (i.e., the capacity of pre-charging the bitline BL and discriminating the datum stored in the shortest possible time) and increase in accuracy (i.e., the capacity of discriminating a minimum difference between the cell-reading current $I_{cell}$ and the reference reading current $I_{ref}$).

In particular, the present Applicant has found that the presence of offsets and mismatches in the sense-amplifier circuit 10 (for example, due to differences in the manufacturing process of the electronic components, to variations due to ageing of the components, or to environmental factors) represents an obstacle in achieving the aforesaid compromise, and in general represents a critical aspect in determining the performance and reliability of the non-volatile memory device 1.

One aspect of the present solution envisages, in a circuit architecture of a sense-amplifier circuit substantially similar to the one described with reference to FIG. 2 (here not described in detail again), a particular embodiment of the current-to-voltage converter stage, once again designated by 12, designed to compensate offsets due to mismatches in the circuit components for enabling discrimination during reading of even small current differences, at the same time ensuring a short access time and a low current consumption.

As will be discussed in detail hereinafter, this embodiment envisages the presence of a capacitive compensation module, operable for compensating the offsets present in the circuit during a compensation step (or phase), preliminary to, and distinct from, the reading step (or phase). A switching module is coupled to the capacitive compensation module and is operable for switching the operating state of the circuit from the compensation step to the actual reading step of the datum stored in the memory cell.

Figure 3:
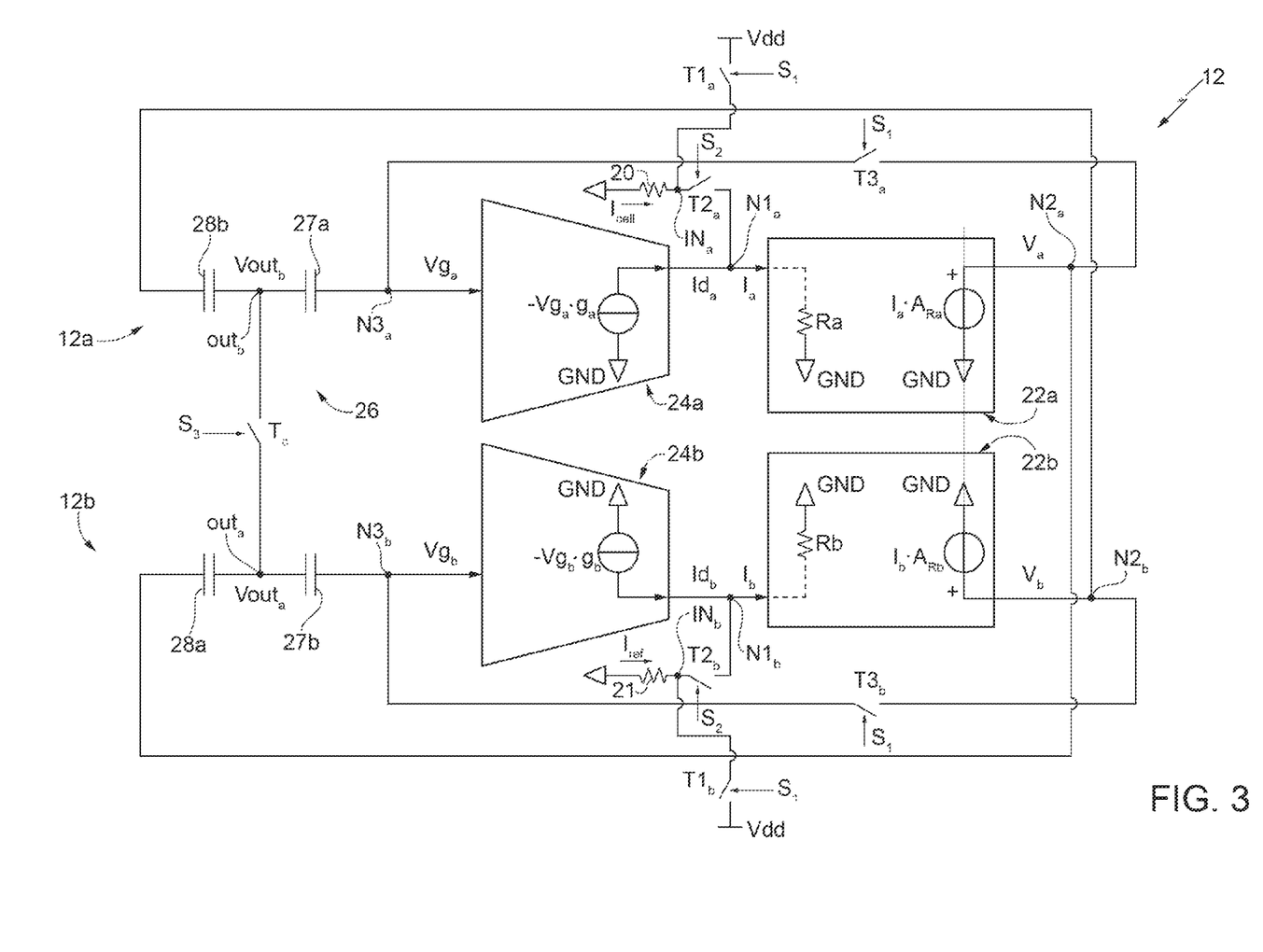
FIG. 3 shows a block diagram of a current-to-voltage converter stage in the sense-amplifier circuit of FIG. 2, according to a first embodiment of the present solution.

With reference to FIG. 3, a first embodiment of the current-to-voltage converter stage 12, which implements the characteristics highlighted previously, is now described.

The current-to-voltage converter stage 12 has a differential structure, with two substantially equivalent circuit branches. A first circuit branch 12a is connected to the first comparison input $IN_a$ and is designed to receive the cell-reading current $I_{cell}$ from the selected memory cell 3, here represented schematically by a resistive load constituted by a cell resistor 20. A second circuit branch 12b is connected to the second comparison input $IN_b$ and is designed to receive the reference reading current $I_{ref}$ from the reference generator or cell, here represented schematically by a reference resistor 21.

In what follows, only the first circuit branch 12a will be described, altogether similar considerations applying to the second circuit branch 12b (it is further highlighted that in what follows the suffix "a" will be used for designating components constituting the first circuit branch 12a, and the suffix "b" will be used for designating components constituting the second circuit branch 12b).

In detail, the first circuit branch 12a comprises a first switch $T1_a$, which is arranged between the first comparison input $IN_a$ and the supply input receiving the supply voltage $V_{dd}$ and is controlled by a first control signal $S_1$ (for example, generated by and received from a managing unit, for managing general operation of the non-volatile memory device 1, not illustrated herein). A second switch $T2_a$ is arranged between the same first comparison input $IN_a$ and a first internal node $N1_a$, and is controlled by a second control signal $S_2$ (which is also, for example, generated by the managing unit for managing general operation of the non-volatile memory device 1).

An amplifier module 22a has an input connected to the first internal node $N1_a$ and an output that defines a second internal node $N2_a$ and supplies an amplified voltage $V_a$, which is a function of an internal current $I_a$ at the output from the first internal node $N1_a$, according to the relation $$V_a = I_a \cdot A_{Ra}$$

where $A_{Ra}$ is the amplification factor of the amplifier module 22a and $R_a$ is an equivalent resistive load coupled to the input of the amplifier module 22a.

A third switch $T3_a$ is arranged between the second internal node $N2_a$ and a third internal node $N3_a$, on which a feedback voltage $Vg_a$ is present, and is controlled by the first control signal $S_1$. A transconductance module 24a has an input connected to the third internal node $N3_a$ and an output that is connected to the first internal node $N1_a$ and supplies a regeneration current $Id_a$ at input to the first internal node $N1_a$, which is a function of the feedback voltage $Vg_a$, according to the relation $$Id_a = -Vg_a \cdot g_a$$

where $g_a$ is the transconductance factor of the transconductance module 24a.

According to a particular aspect of the present solution, the current-to-voltage converter stage 12 further comprises a capacitive compensation module 26, which couples in a crossed way the first and second circuit branches 12a, 12b; namely, it couples the second internal node $N2_a$, $N2_b$ of each circuit branch 12a, 12b, on which the respective amplified voltage $V_a$, $V_b$ is present, being a function of the internal current $I_a$, $I_b$ present on the first internal node $N1_a$, $N1_b$ of the circuit branch 12a, 12b, with the third internal node $N3_b$, $N3_a$ of the other circuit branch 12b, 12a, on which the respective feedback voltage $Vg_b$, $Vg_a$ is present.

The capacitive compensation module 26 is configured to detect and store the offsets present in the current-to-voltage converter stage 12 during the compensation step, preliminary to the step of reading of the datum stored, and in particular the voltage offset ΔV, defined as the unbalancing (for example, due to mismatch in the values of the circuit components) between the amplified voltages $V_a$, $V_b$ of the first and second circuit branches 12a, 12b:

$$\Delta V = V_a - V_b$$

(or likewise between the feedback voltages $Vg_a$ and $Vg_b$, with the respective third switch $T3_a$, $T3_b$ driven into the closed state by the first control signal $S_1$).

The capacitive compensation module 26 is further configured to enable compensation of this voltage offset ΔV in the subsequent step of reading of the datum stored in the memory cell 3.

In greater detail, in this first embodiment, the capacitive compensation module 26 comprises, for each circuit branch 12a, 12b a first compensation capacitor 27a, 27b is connected between the third internal node $N3_a$, $N3_b$ of each circuit branch 12a, 12b and an output terminal $out_b$, $out_a$ of the other circuit branch 12b, 12a, present on which is an output voltage $Vout_b$, $Vout_a$ (which is a function of the amplified voltage $V_b$, $V_a$ of the other circuit branch 12b, 12a). The difference between the output voltages $Vout_a$, $Vout_b$ defines the output voltage Vout of the current-to-voltage converter stage 12: $Vout=Vout_b-Vout_a$. Each circuit branch 12a, 12b also includes a second compensation capacitor 28a, 28b connected between the second internal node $N2_a$, $N2_b$ and the output terminal $out_a$, $out_b$ of the same circuit branch 12a, 12b of the current-to-voltage converter stage 12.

The current-to-voltage converter stage 12 further comprises a coupling switch $T_c$, arranged between the output terminals $out_a$, $out_b$ of the circuit branches 12a, 12b, and controlled by a third control signal $S_3$.

Operation of the current-to-voltage converter stage 12 is now described, in particular during a memory reading operation, which is articulated in three distinct and consecutive operating steps (or phases):

a first operating step, of pre-charging of the bitline BL and storage and erasure of the offsets;

a second operating step, which is a waiting step; and a third operating step, of actual reading of the datum stored, with offset compensation.

In detail, during the first operating step, the first switch $T1_a$, $T1_b$ of both of the circuit branches 12a, 12b is switched into the closed state (by the first control signal $S_1$), whereas the second switch $T2_a$, $T2_b$ of both of the circuit branches 12a, 12b is switched into the open state (by the second control signal $S_2$).

In this operating condition, pre-charging of the bitline BL (and possibly of the reference cell) takes place through the biasing transistors 14a, 14b (see FIG. 2 and the foregoing discussion). The biasing mode of the gate terminals of the biasing transistors 14a, 14b may be one of several types (for example, with constant or dynamic biasing).

Furthermore, the third switch $T3_a$, $T3_b$ of both of the circuit branches 12a, 12b is switched into the closed state (by the same first control signal $S_1$), and the coupling switch $T_c$ is switched into the closed state (by the third control signal $S_3$).

In this step, the offset (due, for example, to mismatches of the components) between the amplified voltages $V_a$, $V_b$ of the first and second circuit branches 12a, 12b, which is equivalent to the offset between the feedback voltages $Vg_a$, $Vg_b$ ($\Delta V = Vg_a - Vg_b$), is stored in the compensation capacitors 27a-27b, 28a-28b of the capacitive compensation module 26, by storing a compensation electric charge.

In particular, given that the coupling switch $T_c$ is closed, the output voltages $Vout_a$, $Vout_b$ (which represent the differential outputs of the current-to-voltage converter stage 12) have a same value, which satisfies the following relation:

$$Vout_a = Vout_b \approx (Vg_a + Vg_b)/2$$

In other words, on each compensation capacitor 27a-27b, 28a-28b a voltage equal to ΔV/2 is basically stored.

Next, in the subsequent waiting step, the first switch $T1_a$, $T1_b$ of both of the circuit branches 12a, 12b is switched into the open state (by the first control signal $S_1$). Furthermore, the third switch $T3_a$, $T3_b$ of both of the circuit branches 12a, 12b is switched into the open state, whereas the coupling switch $T_c$ remains in the closed state. In this way, the offset-compensation electric charge remains stored in the compensation capacitors 27a-27b, 28a-28b.

Immediately after, the second switch $T2_a$, $T2_b$ of the same circuit branches 12a, 12b is switched into the closed state. In this way, pre-charging through the biasing transistors 14a, 14b is interrupted, and the voltage to the drain terminals of the biasing transistors 14a, 14b starts to discharge via the cell-reading current $I_{cell}$ and the reference reading current $I_{ref}$.

Moreover, the permanence in the closed state of the coupling switch $T_c$ makes it possible to block evolution of the regeneration loop (due to the positive feedback between the output of the amplifier module 22a and the input of the transconductance module 24a), thus preventing switching due to the noise introduced by switching of the second switch $T2_a$, $T2_b$ (and discharge of the drain terminals of the biasing transistors 14a, 14b). This means that the subsequent operation of reading of the datum stored in the memory cell 3 is only a function of the differences between the cell-reading current $I_{cell}$ and the reference reading current $I_{ref}$.

In the subsequent step of actual reading of the datum stored in the memory cell 3, the coupling switch $T_c$ is switched into the open state by the third control signal $S_3$ (the switching state of the other switches $T1_a$-$T1_b$, $T2_a$-$T2_b$, $T3_a$-$T3_b$ remains, instead, unvaried from the previous operating step, the waiting step).

In this operating step, the two circuit branches 12a, 12b define a respective regeneration amplification loop, closed on a capacitive path defined by the respective compensation capacitors 27a-27b, 28a-28b of the offset-compensation module 26.

This regeneration amplification loop is unbalanced from the metastable state reached in the previous waiting step exclusively by the difference between the cell-reading current $I_{cell}$ and the reference reading current $I_{ref}$. In other words, the initial gain of the amplification loop is modified by the resistive loads constituted by the selected bitline BL, and by the reference cell or reference generator (cell resistor 20 and reference resistor 21).

Due to unbalancing, the output voltages $Vout_a$, $Vout_b$ evolve in opposite direction. In particular:

if $I_{cell} > I_{ref}$, then $Vout_a < Vout_b$ (Vout>0); and
if $I_{cell} < I_{ref}$, then $Vout_a > Vout_b$ (Vout<0).

Figure 4A:
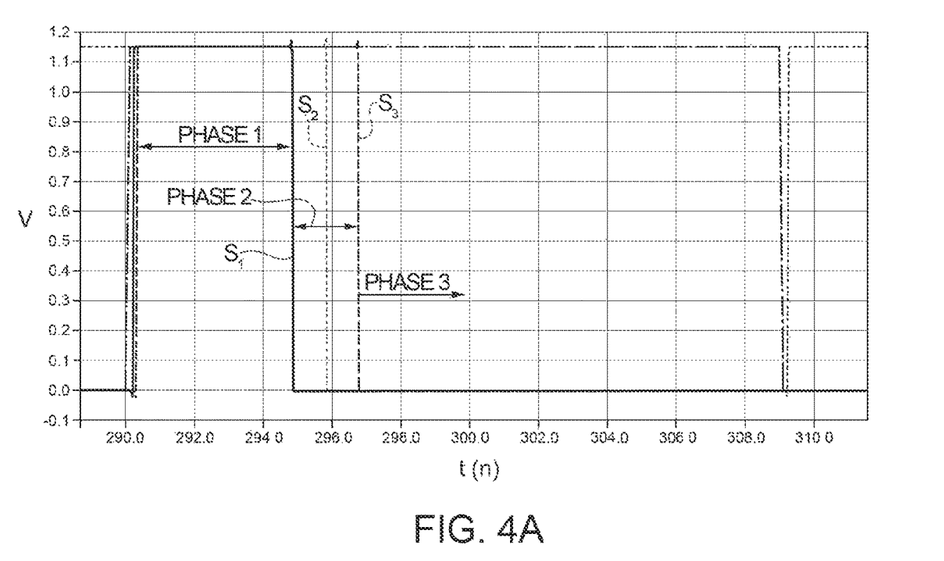
FIGS. 4a and 4b show the trend of electrical quantities in the current-to-voltage converter stage of FIG. 3.

FIG. 4a shows, with reference to the operating steps described previously (designated by "step 1", "step 2", and "step 3"), the evolution of the first control signal $S_1$, of the second control signal $S_2$, and of the third control signal $S_3$.

Figure 4B:
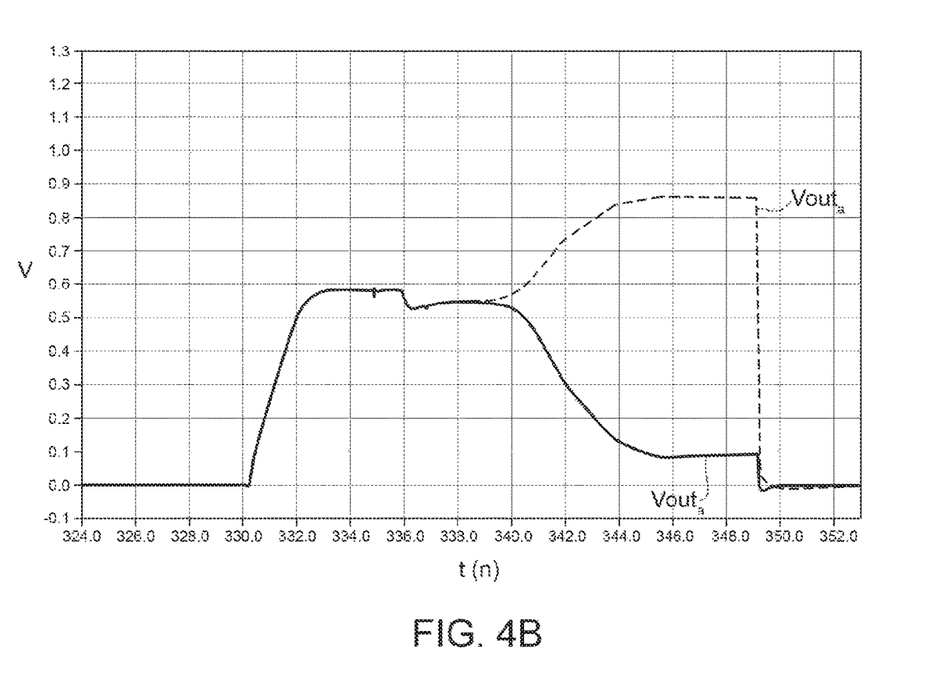

FIG. 4b shows, instead, the evolution of the output voltages $Vout_a$, $Vout_b$ that define the differential output Vout of the current-to-voltage converter stage 12.

In particular, in the example illustrated, the access time, required for the entire reading operation, which comprises the steps of pre-charging, waiting and actual reading of the datum stored, is approximately 10 μs (considering a difference between the cell-reading current $I_{cell}$ and the reference reading current $I_{ref}$ of the order of 100 nA).

Figure 5:
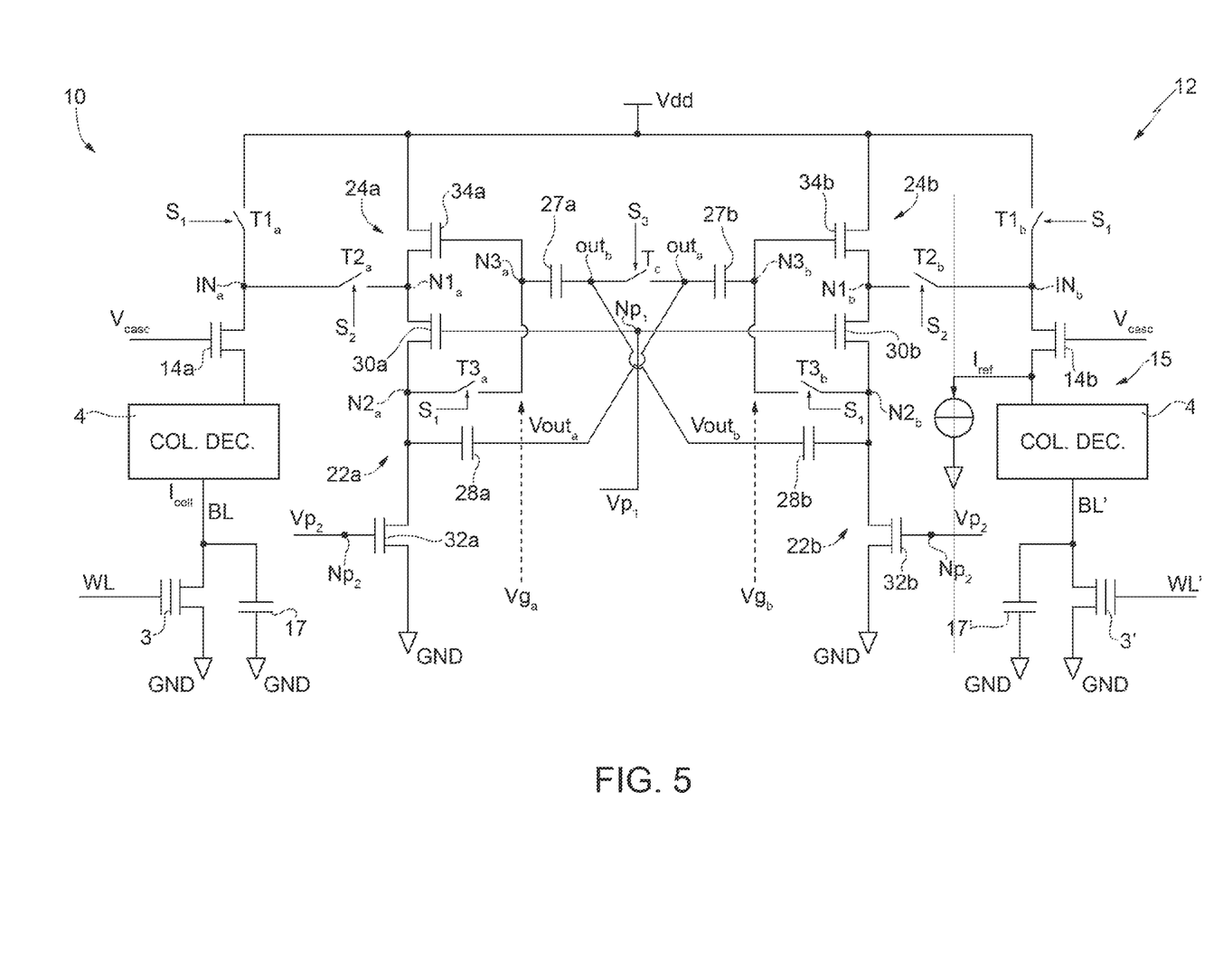
FIG. 5 shows in greater detail a possible circuit embodiment of the current-to-voltage converter stage of FIG. 3.

With reference to FIG. 5, a possible circuit implementation of the current-to-voltage converter stage 12 is now described. It should be noted that FIG. 5 shows the memory cell 3 selected for reading operation with cell-reading current $I_{cell}$ (and parasitic line capacitance 17), and furthermore a reference current $I_{ref}$ that may be generated in various ways by a reference-current structure, designated as a whole by 15.

The cell designated by 3' (with the corresponding parasitic line capacitance 17') here represents a possible portion of memory array arranged symmetrically with respect to the part selected for reading, which may be used for balancing the capacitive load of the sense amplifier 10 (in this case, the corresponding wordlines WL' is not selected), or else the same cell 3' may be used as reference for generating the reference current $I_{ref}$ for the comparison (in this case, the reference-current generator may not be present).

In this embodiment, the amplifier stage 22a (it should be noted that once again reference is made only to the first circuit branch 12a, except where otherwise specified) comprises a first amplification transistor 30a and a second amplification transistor 32a. The first amplification transistor 30a, of a PMOS type, is connected between the first internal node $N1_a$ and the second internal node $N2_a$ and has its control terminal connected to a first biasing node $Np_1$ (common for both circuit branches 12a, 12b), on which it receives a first internal biasing voltage $Vp_1$, of an appropriate value. The second amplification transistor 32a, of an NMOS type is connected between the second internal node $N2_a$ and the ground reference GND and has its control terminal connected to a second biasing node $Np_2$ (common for both circuit branches 12a, 12b), on which it receives a second internal biasing voltage $Vp_2$ of an appropriate value.

The transconductance stage 24a in turn comprises a transconductance transistor 34a, of a PMOS type, connected between the first internal node $N1_a$ and the supply input that receives the supply voltage $V_{dd}$ and having its control terminal connected to the third internal node $N3_a$.

The circuit embodiment shown in FIG. 5 is such as to implement, as will be evident for a person skilled in the field, the operation described in detail previously, and in particular the operating steps of pre-charging of the bitline BL and storage and erasure of the offsets, the waiting step, and the step of actual reading of the datum stored, with offset compensation.

Figure 6:
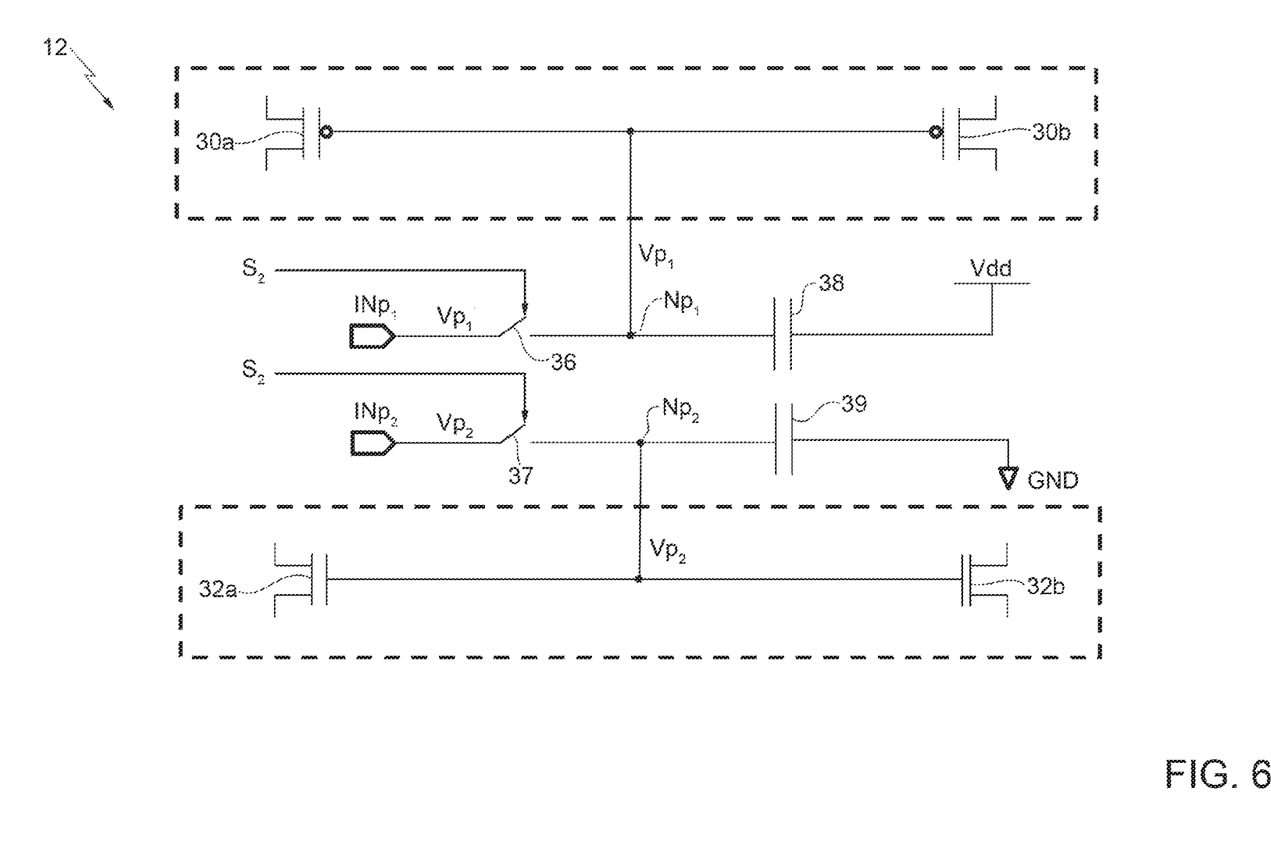
FIG. 6 shows a biasing portion of the current-to-voltage converter stage, according to one aspect of the present solution.

With reference to FIG. 6, a further aspect of the present solution is now described, which envisages that the first and second biasing nodes Np1, Np2 are left floating during the step of actual reading of the datum stored (third step of the reading operation previously described in detail).

In this way, advantageously, each sense-amplifier circuit 10 in the non-volatile memory device 1 is kept isolated from the other circuits and from the related switching noise, thus further improving the electrical characteristics thereof.

Referring to FIG. 6, a first decoupling switch 36 is controlled by the second control signal $S_2$ and is connected between the first biasing node $Np_1$ and a first biasing input $INp_1$, where it receives a first biasing voltage $Vp_1'$, of an appropriate value, for example, from a biasing source of the managing unit of the non-volatile memory device 1 (not illustrated herein). A second decoupling switch 37 is also controlled by the second control signal $S_2$ and is connected between the second biasing node $Np_2$ and a second biasing input $Inp_2$, where it receives a second biasing voltage $Vp_2'$, of an appropriate value, for example, from a respective biasing source of the managing unit of the non-volatile memory device 1 (not illustrated herein).

A first hold capacitor 38, for example, of the value of 10 fF, is connected between the first biasing node $Np_1$ and the supply input that receives the supply voltage $V_{dd}$. In addition, a second hold capacitor 39, which has also for example, the value of 10 fF, is connected between the second biasing node $Np_2$ and the ground reference GND.

In use, the first and second biasing nodes $Np_1$, $Np_2$, during reading operation, are biased by the respective biasing sources at the respective biasing voltages $Vp_1'$, $Vp_2'$ until start of the third step of reading of the datum stored in the memory cell 3.

At start of the third step, the second control signal S2 causes opening of the first and second decoupling switches 36, 37, so that the first and second biasing nodes $Np_1$, $Np_2$ are floating.

In this third step, the value of the first and second internal biasing voltages $Vp_1$, $Vp_2$ (determined up to that moment directly by the biasing voltages $Vp_1'$, $Vp_2'$) is maintained by the first and second hold capacitors 38, 39, which have been previously charged to the value of the same biasing voltages $Vp_1'$, $Vp_2'$.

Figure 7:
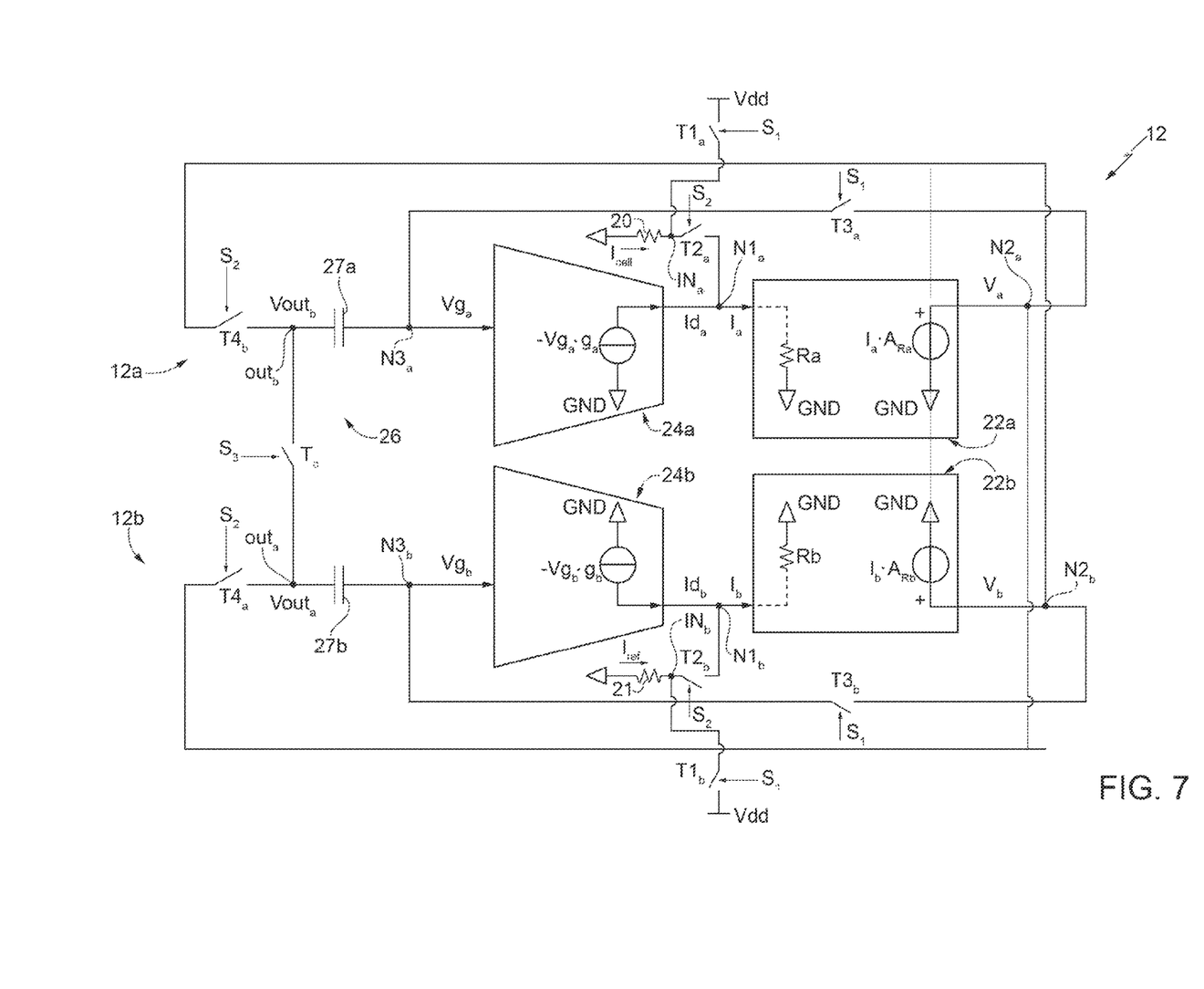
FIG. 7 shows a block diagram of a current-to-voltage converter stage according to a second embodiment of the present solution.
Figure 8:
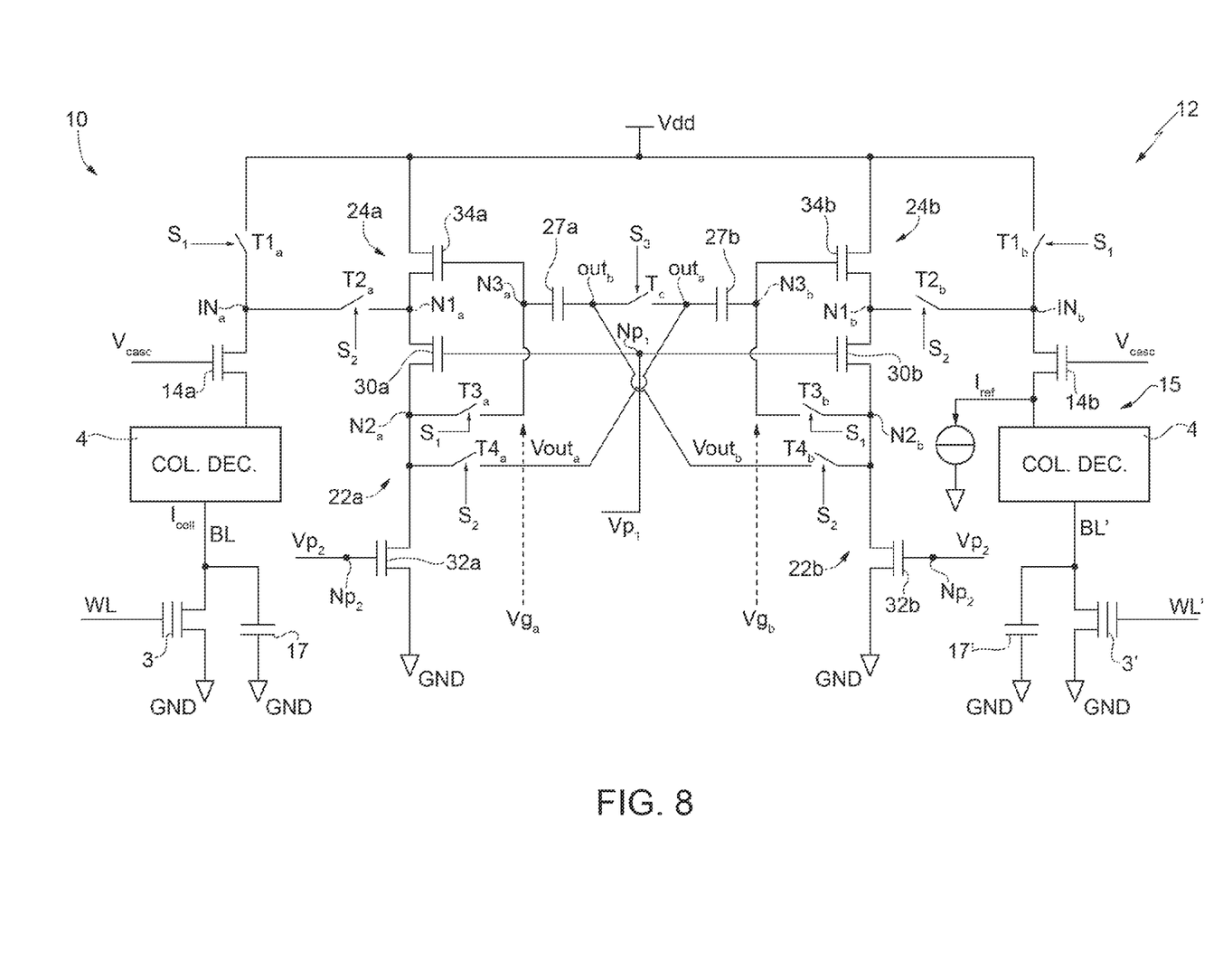
FIG. 8 shows in greater detail a possible circuit embodiment of the current-to-voltage converter stage of FIG. 7.

With reference to FIGS. 7 and 8, a second embodiment of the current-to-voltage converter stage 12 of the sense-amplifier circuit 10 is now described.

This second embodiment differs from the first embodiment previously described in detail for a different configuration of the capacitive compensation module 26, once again configured to detect and store the offsets present in the current-to-voltage converter stage 12 during the compensation step, preliminary to the step of actual reading, and to enable compensation of this voltage offset ΔV in the subsequent step of reading of the data stored in the memory cells 3.

In detail, in this second embodiment, the capacitive compensation module 26 only comprises, for each circuit branch 12a, 12b, the first compensation capacitor 27a, 27b connected between the third internal node $N3_a$, $N3_b$ of the respective circuit branch 12a, 12b and the output terminal $out_b$, $out_a$ of the other circuit branch 12b, 12a of the current-to-voltage converter stage 12, on which the corresponding output voltage $Vout_b$, $Vout_a$ is present.

Instead of the second compensation capacitor 28a, 28b, the capacitive compensation module 26 comprises in this case, for each circuit branch 12a, 12b, a fourth switch $T4_a$, $T4_b$, is arranged between the second internal node $N2_a$, $N2_b$ of the same circuit branch 12a, 12b and the output terminal $out_b$, $out_a$ of the other circuit branch 12b, 12a, and controlled by the second control signal $S_2$.

General operation of the capacitive compensation module 26 (and of the current-to-voltage converter stage 12) does not differ substantially from what has been illustrated previously (with the difference of the appropriate switching of the fourth switches $T4_a$, $T4_b$).

The present Applicant has, however, found, at least for certain operating conditions, that this second embodiment is able to guarantee a lower performance in offset compensation as compared to the first embodiment.

The advantages of the proposed solution emerge clearly from the foregoing description.

In any case, it is once again emphasized that the offset present in the sense-amplifier circuit 10, due, for example, to mismatch between the circuit components in the differential-reading architecture, is effectively compensated during pre-charging of the bitlines BL.

Switching of the output out is thus due only to the unbalancing between the cell-reading current $I_{cell}$ and the reference reading current $I_{ref}$, which causes a variation of the loop gain, according to a DC comparison scheme.

The effect of noise due to switching of the switches used for determining the various steps of the reading operation is advantageously eliminated in the waiting step, by means of "freezing" of the regeneration loop.

The solution proposed thus enables an extremely fast reading, also thanks to the fact that switching of the output starts from a metastable state (typical reading times are of the order of tens of nanoseconds, including the pre-charging step and the step of switching of the output out).

Furthermore, the reading error has a very low dispersion, notwithstanding the high reading speed; the present Applicant has found a dispersion $\sigma(\Delta I)$ of approximately 70 nA, as against dispersions of the order of 500 nA of traditional solutions, with comparable access times.

Also, the current consumption of the solution proposed is reduced; the present Applicant has found a consumption of approximately 0.22 μA/MHz, as against a consumption of the order of 0.8 μA/MHz of traditional solutions.

Finally, it is clear that modifications and variations may be made to what has been described and illustrated herein, without thereby departing from the scope of the present invention, as defined in the annexed claims.

In particular, it is underlined that the solution described may be applied in different types of non-volatile memory devices (for example, embedded or stand-alone flash devices) or devices of a PCM type, where a comparison of current is required for reading the stored data.

What is claimed is:

1. A method for operating a non-volatile memory device using a sense amplifier that includes a first branch and a second branch, the method comprising:
during a pre-charging step, biasing a bit line of a memory array of the non-volatile memory device in order to pre-charge the bit line, wherein a memory cell with data to be read is coupled to the bit line;
during the pre-charging step, detecting and storing an offset between the first branch and the second branch;
during a reading step subsequent to the pre-charging step, receiving a cell current from the bit line at the first branch and a reference current from a current-reference structure at the second branch;
during the reading step, generating an amplified voltage as a function of the cell current and the reference current; and
during the reading step, generating an output voltage based on the amplified voltage compensated by the offset stored during the pre-charging step.

2. The method according to claim 1, wherein detecting and storing the offset during the pre-charging step comprises generating a regeneration current from the amplified voltage, the regeneration current being stored capacitively.

3. The method according to claim 2, wherein the sense amplifier comprises a switching module, the method further comprising causing the switching module to switch between the pre-charging step and reading step so the regeneration current is capacitively stored at an output node during the pre-charging step and so that the output voltage is generated at the output node during the reading step.

4. The method according to claim 1, wherein the sense amplifier comprises a current-to-voltage converter stage the first branch and the second branch;
wherein, during the reading step, the current-to-voltage converter stage receives the cell current and the reference current at a comparison input;
wherein the output voltage is generated between a first differential output terminal and a second differential output terminal;
wherein the first branch and the second branch each comprise a respective amplification module that generates the amplified voltage during the reading step; and
wherein the current-to-voltage converter stage further comprises a capacitive compensation module that detects and stores the offset during the pre-charging step and compensates for the offset during the reading step;
wherein the first branch and the second branch each further comprise a respective transconductance module, each transconductance module comprising a respective input, selectively connected to an output of the respective amplification module, wherein each transconductance module receives a respective feedback voltage during the pre-charging step, and a respective output connected to an input of the respective amplification module that supplies a respective regeneration current, which is a function of the respective feedback voltage; and
wherein the current-to-voltage converter stage further comprises a switching module coupled to the capacitive compensation module, the switching module switching the current-to-voltage converter stage from the pre-charging step to the reading step.

5. The method according to claim 4, wherein during the pre-charging step the switching module electrically decouples the comparison input from the input of the respective amplification module and electrically couples the output of the respective amplification module to the input of the respective transconductance module to store the offset between the first branch and the second branch using the capacitive compensation module; and
during the reading step, the switching module electrically couples the comparison input to the input of the respective amplification module, electrically decouples the output of the respective amplification module from the input of the respective transconductance module, and enables electrical coupling of the output of the respective amplification module to the respective first and second differential output terminals.

6. The method according to claim 4, wherein the switching module comprises a coupling switch arranged between the first and second differential output terminals and controlled by a respective control signal, wherein the switching module electrically couples the first and second differential output terminals during the pre-charging step and also during a waiting step that is temporally set between the pre-charging step and the reading step, and electrically decouples the first and second differential output terminals during the reading step.

7. A sense-amplifier circuit, of a non-volatile memory device having a memory array with memory cells arranged in wordlines and bitlines, the sense-amplifier circuit comprising:
a biasing stage, configured to bias a bitline of the memory array in order to pre-charge the bitline in a pre-charging step of a reading operation of a datum stored in a corresponding memory cell; and
a current-to-voltage converter stage, having a differential configuration with a first circuit branch and a second circuit branch, wherein the current-to-voltage converter stage is configured to receive on a respective comparison input, during a reading step of the datum subsequent to the pre-charging step, a cell current from the bitline and a reference current from a current-reference structure and to supply an output voltage between a respective first differential output terminal and second differential output terminal, wherein the first and second circuit branches each comprise a respective amplification module, configured to generate during the reading step a respective amplified voltage as a function, respectively, of the cell current and of the reference current, the output voltage being a function of the difference between the respective amplified voltages and indicative of a value of the datum, and wherein the current-to-voltage converter stage comprises a capacitive compensation module configured to detect and store an offset between the first circuit branch and the second circuit branch during the pre-charging step, and to compensate the offset in the output voltage during the reading step of the stored datum.

8. The circuit according to claim 7, wherein the first and second circuit branches each further comprise a respective transconductance module, each transconductance module comprising:
a respective input, selectively connected to an output of the respective amplification module, wherein each transconductance module is configured, during the pre-charging step, to receive a respective feedback voltage; and
a respective output connected to an input of the respective amplification module and designed to supply a respective regeneration current, which is a function of the respective feedback voltage.

9. The circuit according to claim 8, wherein, for each of the first and second circuit branches, the capacitive compensation module comprises a respective first compensation capacitor coupled between the input of the respective transconductance module and the respective differential output terminal of the other of the first and second circuit branches.

10. The circuit according to claim 9, wherein, for each of the first and second circuit branches, the capacitive compensation module further comprises a respective second compensation capacitor coupled between the respective differential output terminal and the output of the respective amplification module.

11. The circuit according to claim 8, wherein the current-to-voltage converter stage further comprises a switching module, which is coupled to the capacitive compensation module and is operable for switching an operating state of the current-to-voltage converter stage from the pre-charging step to the reading step.

12. The circuit according to claim 11, wherein the switching module is configured to:
during the pre-charging step, electrically decouple the respective comparison input from the input of the respective amplification module and electrically couple the output of the respective amplification module to the input of the respective transconductance module to enable storage of the offset between the first and second circuit branches by the capacitive compensation module; and
during the reading step of the datum stored, electrically couple the comparison input to the input of the respective amplification module, electrically decouple the output of the respective amplification module from the input of the respective transconductance module, and enable electrical coupling of the output of the respective amplification module to the respective first and second differential output terminals.

13. The circuit according to claim 11, wherein, for each of the first and second circuit branches, the switching module comprises:
a first switch arranged between a respective comparison input and a supply input that receives a supply voltage, and controlled by a first control signal;
a second switch arranged between the respective comparison input and the input of the respective amplification module and controlled by a second control signal; and
a third switch, arranged between the output of the respective amplification module and the input of the respective transconductance module and controlled by the first control signal.

14. The circuit according to claim 13, wherein, for each of the first and second circuit branches, the switching module further comprises a fourth switch arranged between the output of the respective amplification module and the respective first and second differential output terminals, the fourth switch being controlled by the second control signal.

15. The circuit according to claim 11, wherein the switching module further comprises a coupling switch arranged between the respective first and second differential output terminals and controlled by a respective control signal, wherein the switching module is configured to electrically couple the respective first and second differential output terminals during the pre-charging step and also during a waiting step of the reading operation, temporally set between the pre-charging step and the reading step of the datum stored, and to electrically decouple the respective first and second differential output terminals during the reading step of the datum stored.

16. The circuit according to claim 8, wherein the transconductance module of each of the first and second circuit branches comprises a transconductance transistor, coupled between the input of the respective amplification module and a supply input that receives a supply voltage and having its control terminal connected to the input of the transconductance module, and wherein the respective amplifier module of each of the first and second circuit branches comprises:
a first amplification transistor coupled between the input of the respective amplification module and the output of the respective amplification module and having a control terminal connected to a first biasing node, on which it receives a first internal biasing voltage; and
a second amplification transistor coupled between the output of the respective amplification module and a ground reference and having a control terminal connected to a second biasing node, on which it receives a second internal biasing voltage.

17. The circuit according to claim 16, wherein the current-to-voltage converter stage further comprises a decoupling module that is configured to bring the first biasing node and the second biasing node into a floating state during the reading step, and a hold module that is configured to maintain the value of the first internal biasing voltage and the second internal biasing voltage during the reading step.

18. The circuit according to claim 17, wherein the decoupling module comprises a first decoupling switch coupled between the first biasing node and a first biasing input, on which it receives a first biasing voltage, and a second decoupling switch, connected between the second biasing node and a second biasing input, on which it receives a second biasing voltage; and wherein the hold module comprises a first hold capacitor coupled between the first biasing node and a supply input, and a second hold capacitor coupled between the second biasing node and a ground reference.

19. A non-volatile memory device, comprising:
a memory array having memory cells arranged in wordlines and bitlines; and
a sense-amplifier circuit coupled to the memory array and configured to implement a reading operation of data stored in the memory cells of the memory array, the reading operation comprising a pre-charging step and a subsequent reading step, wherein the sense-amplifier circuit comprises a biasing stage and a current-to-voltage converter stage;
wherein the biasing stage is configured to bias a bitline of the memory array in order to pre-charge the bitline in the pre-charging step;
wherein the current-to-voltage converter stage has a differential configuration with a first circuit branch and a second circuit branch;
wherein the current-to-voltage converter stage is configured to receive on a respective comparison input, during the reading step, a cell current from the bitline and a reference current from a current-reference structure and to supply an output voltage between a respective first differential output terminal and second differential output terminal;
wherein the first and second circuit branches each comprise a respective amplification module, configured to generate during the reading step a respective amplified voltage as a function, respectively, of the cell current and of the reference current, the output voltage being a function of the difference between the respective amplified voltages and indicative of a value of the data; and
wherein the current-to-voltage converter stage comprises a capacitive compensation module configured to detect and store an offset between the first circuit branch and the second circuit branch during the pre-charging step, and to compensate the offset in the output voltage during the reading step.

20. The non-volatile memory device according to claim 19, wherein the first and second circuit branches each further comprise a respective transconductance module, each transconductance module comprising:
a respective input, selectively connected to an output of the respective amplification module, wherein each transconductance module is configured, during the pre-charging step, to receive a respective feedback voltage; and
a respective output connected to an input of the respective amplification module and designed to supply a respective regeneration current, which is a function of the respective feedback voltage.

21. A sense amplifier for use in reading data from a non-volatile memory device, the sense amplifier comprising:
means for biasing a bit line of a memory array of the non-volatile memory device, during a pre-charging step, in order to pre-charge the bit line;
means for detecting and storing, during the pre-charging step, an offset between a first branch and a second branch of the sense amplifier;
means for generating, during a reading step subsequent to the pre-charging step, an amplified voltage as a function of a cell current received at the first branch and a reference current received at the second branch; and
means for generating, during the reading step, an output voltage based on the amplified voltage compensated by the offset stored during the pre-charging step.

* * * * *